United States Patent
Tihanyi

(10) Patent No.: US 7,453,308 B2
(45) Date of Patent: Nov. 18, 2008

(54) CIRCUIT ARRANGEMENT HAVING A LOAD TRANSISTOR AND A VOLTAGE LIMITING CIRCUIT AND METHOD FOR DRIVING A LOAD TRANSISTOR

(75) Inventor: Jenoe Tihanyi, Kirchheim (DE)

(73) Assignee: Infineon Technologies AG, Munich (DE)

( * ) Notice: Subject to any disclaimer, the term of this patent is extended or adjusted under 35 U.S.C. 154(b) by 197 days.

(21) Appl. No.: 11/057,098

(22) Filed: Feb. 11, 2005

(65) Prior Publication Data

US 2005/0189965 A1      Sep. 1, 2005

(30) Foreign Application Priority Data

Feb. 13, 2004      (DE) ........................ 10 2004 007 208

(51) Int. Cl.
    *H03L 5/00*      (2006.01)
(52) U.S. Cl. .................. 327/309; 327/108; 327/427
(58) Field of Classification Search .................. 327/108, 327/309, 427
    See application file for complete search history.

(56) References Cited

U.S. PATENT DOCUMENTS

| | | | |
|---|---|---|---|
| 5,347,169 A * | 9/1994 | Preslar et al. ............... | 327/110 |
| 5,352,932 A * | 10/1994 | Tihanyi ...................... | 327/109 |
| 5,401,996 A * | 3/1995 | Kelly .......................... | 257/360 |
| 5,519,341 A * | 5/1996 | Corsi et al. ................... | 327/80 |
| 5,576,648 A * | 11/1996 | Rossi et al. .................. | 327/110 |
| 5,581,432 A * | 12/1996 | Wellnitz et al. ............... | 361/56 |
| 5,883,537 A * | 3/1999 | Luoni et al. .................. | 327/318 |
| 6,087,877 A * | 7/2000 | Gonda et al. ................. | 327/309 |
| 6,778,001 B2 * | 8/2004 | Mayama et al. ............. | 327/427 |
| 6,888,711 B2 * | 5/2005 | Kohno ........................ | 361/91.1 |

* cited by examiner

*Primary Examiner*—Kenneth B. Wells
*Assistant Examiner*—Ryan C Jager
(74) *Attorney, Agent, or Firm*—Maginot, Moore & Beck

(57) ABSTRACT

The invention relates to a circuit arrangement having connecting terminals (K1, K2) for application of a supply voltage (V+) and having a load transistor (M) for connecting a load (Z) to the supply voltage, said load transistor having a control terminal (G) and a first and second load terminal (D, S), the control terminal (G) of the load transistor (2) being coupled to a drive terminal (IN) for application of a drive signal (Sin). A voltage limiting circuit (10) is connected between one (D) of the load terminals and the drive terminal (G) of the transistor, a deactivation circuit (20) being provided, which is designed to deactivate the voltage limiting circuit (10) in a manner dependent on the supply voltage (V+).

20 Claims, 5 Drawing Sheets

CIRCUIT ARRANGEMENT HAVING A LOAD TRANSISTOR AND A VOLTAGE LIMITING CIRCUIT AND METHOD FOR DRIVING A LOAD TRANSISTOR

FIELD OF THE INVENTION

The present invention relates to a circuit arrangement having a load transistor and a voltage limiting circuit, and to a method for driving a load transistor.

BACKGROUND

Such a circuit arrangement having a load transistor M and a generally known voltage limiting circuit 10 functioning according to the principle of "active zenering" is illustrated in FIG. 1. In the example, the load transistor M is designed as an n-type MOSFET that serves to connect a load Z to a supply voltage according to an input signal Sin present at a drive input IN. A driver circuit DRV serves for converting the drive signal Sin to suitable levels for driving the transistor M. The drain-source path D-S of the transistor, which forms the load path thereof, is connected in series with the load between supply voltage terminals K1, K2 for the purpose of switching the load, one of which supply voltage terminals is at a supply potential V+ and the other of which supply voltage terminals is at reference-ground potential GND. In order to simplify the explanation, it is assumed hereafter that the reference-ground potential is ground, so that the value of the supply potential V+ corresponds to the value of the supply voltage.

The voltage limiting circuit 10 comprises, by way of example, a series circuit formed by at least one zener diode Z1 and a diode D1 connected oppositely to one another, so that there is always one of the components Z1, D1 operated in the reverse direction. This series circuit is connected between the drain terminal D and the gate terminal G of the transistor M.

Referring to FIG. 2, the limiting circuit 10 may also comprise a transistor T1, the load path of which is connected between the drain terminal D and the source terminal S of the load transistor. This transistor T1 is driven by a series circuit formed by a zener diode Z1 and a resistor R1, which series circuit is connected in parallel with the load path D-S of the load transistor M. In this case, the transistor T1 is connected to a node common to the zener diode Z1 and the resistor and is turned on if the drain-source voltage of the load transistor exceeds the breakdown voltage of the zener diode Z1 and the zener diode Z1 is thus turned on.

The voltage limiting circuit or protective circuit 10 connected between the drain terminal D and the gate terminal G of the transistor M protects the load transistor M in the off state from overvoltages by virtue of the limiting circuit 10 turning the transistor M on as soon as the drain-source voltage thereof reaches a predetermined maximum value. This maximum value to which the drain-source voltage of the transistor M is clamped by the protective circuit 10 is essentially determined by the breakdown voltage of the zener diode Z1 in both cases explained above.

Circuits corresponding to the limiting circuit 10 which protect the transistor M from overvoltages are used in a targeted manner in connection with the switching of inductive loads for the purpose of commutating the inductive load Z after the transistor M has turned off. After the presence of a turn-off signal at the drive terminal IN, and thus at the gate terminal of the transistor M, and in the event of the drain-source voltage rising, the limiting circuit 10 in this case holds the transistor M in the on state until the load Z has commutated to an extent such that the load path voltage of the transistor M has fallen below the value of the clamping voltage. During this operating state, in which the overall circuit with the limiting circuit 10 and the transistor M functions in the manner of a zener diode, the energy previously stored in the inductive load Z is converted into heat in the transistor.

Cellularly constructed MOS transistors having a multiplicity of transistor cells that are constructed identically and driven jointly are employed as load transistors in circuits in accordance with FIGS. 1 and 2. Such transistors of recent design, which are optimized in respect of having a low on resistance, may tend toward so-called current splitting in the case of low load currents such as may occur during commutation of inductive loads by means of limiting circuits according to the active zenering operation. This means that the load current is accepted only by a few transistor cells instead of being distributed uniformly over all the cells. In this case, destruction of individual cells and thus destruction of the entire transistor component may occur even though the maximum current-carrying capacity of the component is still far from having been reached. This problem is aggravated as the voltage present across the transistor increases and thus as the supply voltage increases. The supply voltage may rise in particular when a plurality of loads are connected to the supply voltage—like for example in a motor vehicle in which a multiplicity of different loads are connected to the vehicle battery—and when some of the loads are suddenly isolated from the voltage supply. In this context, the jargon talks of a sudden load drop (load dump).

SUMMARY

It is an aim of the present invention to provide a circuit arrangement having a load transistor and a voltage limiting circuit and also a method for driving a load transistor in a circuit having a voltage limiting circuit in which current instabilities of the load transistor are avoided.

This object is achieved by a circuit arrangement having a load transistor and a voltage limit circuit and a method for driving a load transister having the features of the embodiments of the invention.

The circuit arrangement according to the invention comprises connecting terminals for application of a supply voltage, a load transistor having a control terminal and a first and second load terminal for connecting a load to the supply voltage, as well as a drive terminal coupled to the control terminal of the load transistor and serving for application of a drive signal, and a voltage limiting circuit connected between one of the load terminals and the drive terminal of the transistor. In this case, a deactivation circuit is connected to the voltage limiting circuit, said deactivation circuit being designed to deactivate the voltage limiting circuit in a manner dependent on the supply voltage.

In this case, the deactivation circuit is preferably designed in such a way that it deactivates the voltage limiting circuit if the supply voltage exceeds a predetermined voltage value. Said voltage value is chosen for example such that it is not reached by the supply voltage under normal operating states, but rather is only reached under extraordinary operating states, for example in the event of a drop in further loads connected to the same supply voltage. During such operating states, the deactivation circuit ensures that the load transistor cannot be turned on by the voltage limiting circuit, which might otherwise lead, at least occasionally, to small load currents that have voltages present across the load path of the load transistor and thus to a current splitting as already explained in the introduction. If, with the voltage limiting circuit turned off, an overvoltage—for example during the commutation of an inductive load—is present across the load transistor, then the load transistor undergoes transition to the avalanche mode as soon as its avalanche voltage is reached. In the avalanche mode, losses are distributed uniformly over the component between the individual cells, so that the avalanche mode, in the case of small load currents, represents a stabler operating state of the component than an operating state in the event of driving by the voltage limiting circuit.

The deactivation circuit may be designed, in particular, to deactivate the voltage limiting circuit only after a delay time after the supply voltage exceeded the predetermined voltage value has elapsed. Momentary fluctuations in the supply voltage which are shorter than the delay time, and which are so short that they cannot affect the function of the load transistor, are masked out in the case of this embodiment and, consequently, do not lead to a deactivation of the voltage limiting circuit.

In order to deactivate the voltage limiting circuit, the deactivation circuit comprises a switching element, for example, which is driven by a drive circuit in a manner dependent on the supply voltage.

In one embodiment, it is provided that the voltage limiting circuit is deactivated taking account of the drive signal present at the drive input at the earliest with the presence of a turn-off signal at the drive input or at the earliest a predetermined time duration after the presence of such a turn-off signal. With the load transistor switched on, if the supply voltage is present approximately completely across the load, the voltage limiting circuit cannot be deactivated in the case of this embodiment.

The load transistor and the voltage limiting circuit and also the deactivation circuit may either be monolithically integrated in a common semiconductor body or be integrated in separate semiconductor bodies, in particular using chip-on-chip technology. In the case of integration using chip-on-chip technology, the load transistor is integrated in a first semiconductor chip and the voltage limiting circuit and the deactivation circuit are integrated in a second semiconductor chip that is applied on the first semiconductor chip and serves as a logic chip. Further protection or driving functions of the load transistor, such as, for example, an overtemperature protection or a current limiting, may be integrated in said logic chip in a sufficiently known manner, as is known in the case of intelligent semiconductor switches (Smart-FET). When the load transistor is integrated in such an arrangement, it must be taken into account that the maximum voltage that occurs, corresponding to the avalanche voltage of the load transistor, is either lower than the so-called technology voltage of the logic chip, or that an additional protective structure, for example a protective resistor, is present for the logic chip in order to prevent damage to the logic chip during avalanche operation of the load transistor.

In the case of the method according to the invention for driving a load transistor having a drive connection, which is coupled to a drive connection for application of a drive signal, and having a first and second load connection, which serves for connecting a load to a supply voltage, and in which a voltage limiting circuit is connected between one of the load connections and the drive connection, provision is made for deactivating the voltage limiting circuit in a manner dependent on the supply voltage.

BRIEF DESCRIPTION OF THE DRAWINGS

The present invention is explained in more detail below using exemplary embodiments with reference to figures.

DETAILED DESCRIPTION

In the figures, unless specified otherwise, identical reference symbols designate identical circuit components and signals with the same meaning.

Figure 3A:
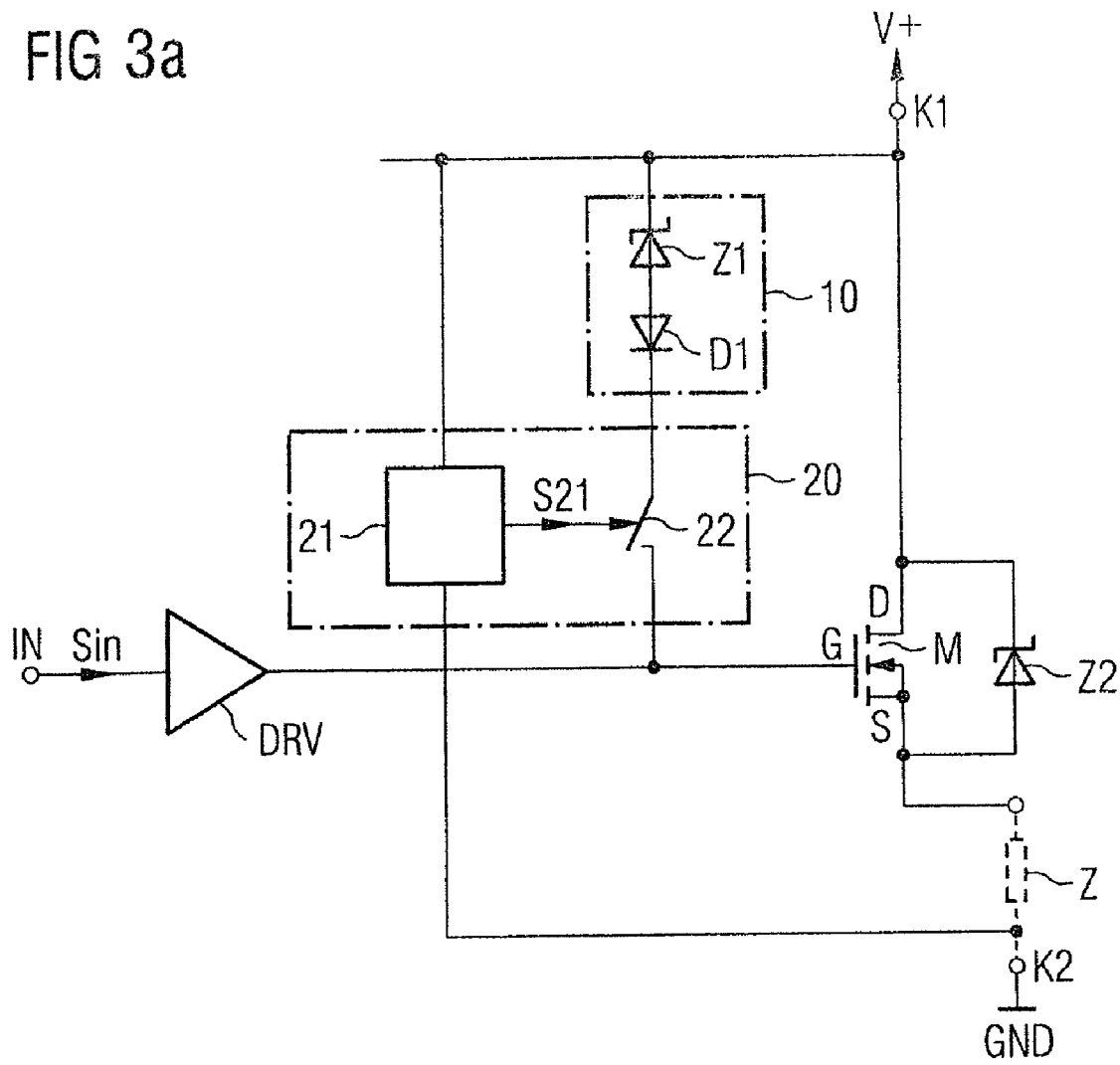
FIG. 3 shows a first exemplary embodiment of a circuit arrangement according to the invention having a load transistor, a voltage limiting circuit and a deactivation circuit serving for deactivating the voltage limiting circuit (FIG. 3a) and the dependence of a drive signal generated by the deactivation circuit as a function of a supply voltage.

The exemplary embodiment of the circuit arrangement according to the invention as illustrated in FIG. 3a comprises a load transistor M designed as an n-conducting MOSFET and serving for connecting a load Z illustrated by broken lines to a supply voltage V+. The supply voltage V+ is present between supply voltage terminals K1, K2, one of which is at supply potential V+ and the other of which is at reference-ground potential, in particular ground. The load path of the load transistor M is formed by the drain-source path D-S thereof, which, for driving the load Z, is connected in series with said load Z between the supply voltage terminals K1, K2. The load transistor illustrated in FIG. 3 functions as a high-side switch and is connected between the first supply voltage terminal K1, which is at supply potential V+, and the load Z. The load transistor M is suitable for switching any desired loads, in particular inductive loads. It should be pointed out that the load Z is not a component part of the circuit arrangement according to the invention and is therefore illustrated merely by broken lines in FIG. 3a.

The circuit arrangement additionally comprises a voltage limiting circuit 10, which, in the exemplary embodiment, has a zener diode Z1 and a diode D1 connected oppositely to the zener diode Z1. Said voltage limiting circuit 10 is connected between the drain connection D and the gate connection G functioning as control connection of the load transistor M.

In order to deactivate said voltage limiting circuit 10 in a manner dependent on the supply voltage V+ present between the supply voltage terminals K1, K2, a deactivation circuit 20 is present, which comprises a switching element 22 connected in series with the voltage limiting circuit 10 between the drain connection D and the gate connection G, said switching element being driven by a drive circuit 21. Said drive circuit 21 is connected to the supply voltage terminals K1, K2 in order to open the switching element 22 in a manner dependent on the supply voltage V+ and thereby to deactivate the voltage limiting circuit 10.

Figure 3B:
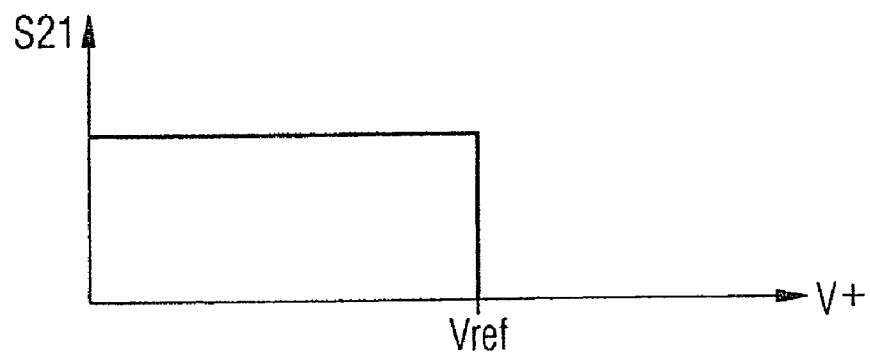

The functioning of the deactivation circuit 20 becomes clear on the basis of the profile—illustrated in FIG. 3b—of a drive signal S21 that drives the switch 22 as a function of the supply voltage V+, it being assumed for explanation purposes that the switch 22 is closed in the event of a high level of the drive signal S21 and is open in the event of a low level of the drive signal S21. As can be gathered from the profile in FIG. 3b, the switch 22 is driven into the on state by means of the drive signal S21 if the supply voltage V+ is less than a predetermined reference value Vref. If the supply voltage V+ exceeds said predetermined reference value Vref, then the switch 22 is opened in a manner driven by the drive signal S21 in order to deactivate the voltage limiting circuit 10.

The reference voltage Vref is preferably chosen such that the supply voltage V+ does not reach said reference value Vref under normal operating conditions. However, if extraordinary operating conditions occur, for example as a result of a load drop of further loads which are connected to the supply voltage V+ and are not specifically illustrated in the figures, and if the supply voltage V+ rises on account of such a load drop, then the voltage limiting circuit 10 is deactivated. The load transistor M can then no longer be driven into the on state via the voltage limiting circuit 10. After deactivation of the voltage limiting circuit 10, the load transistor M undergoes transition to the avalanche mode if its load path voltages reaches the value of the breakdown voltage of its integrated zener diode Z2, which is explicitly illustrated in FIG. 3a. In the case of n-conducting MOSFETs in which body zone and source zone are short-circuited, said integrated zener diode Z2 is formed by the pn junction between the body zone and the drain zone. In modern power MOSFETs, said avalanche mode represents a stabler operating state in comparison with an operating state with small load currents and a high load path voltage that would be established at least shortly after a use of the voltage limiting circuit 10.

Figure 4:
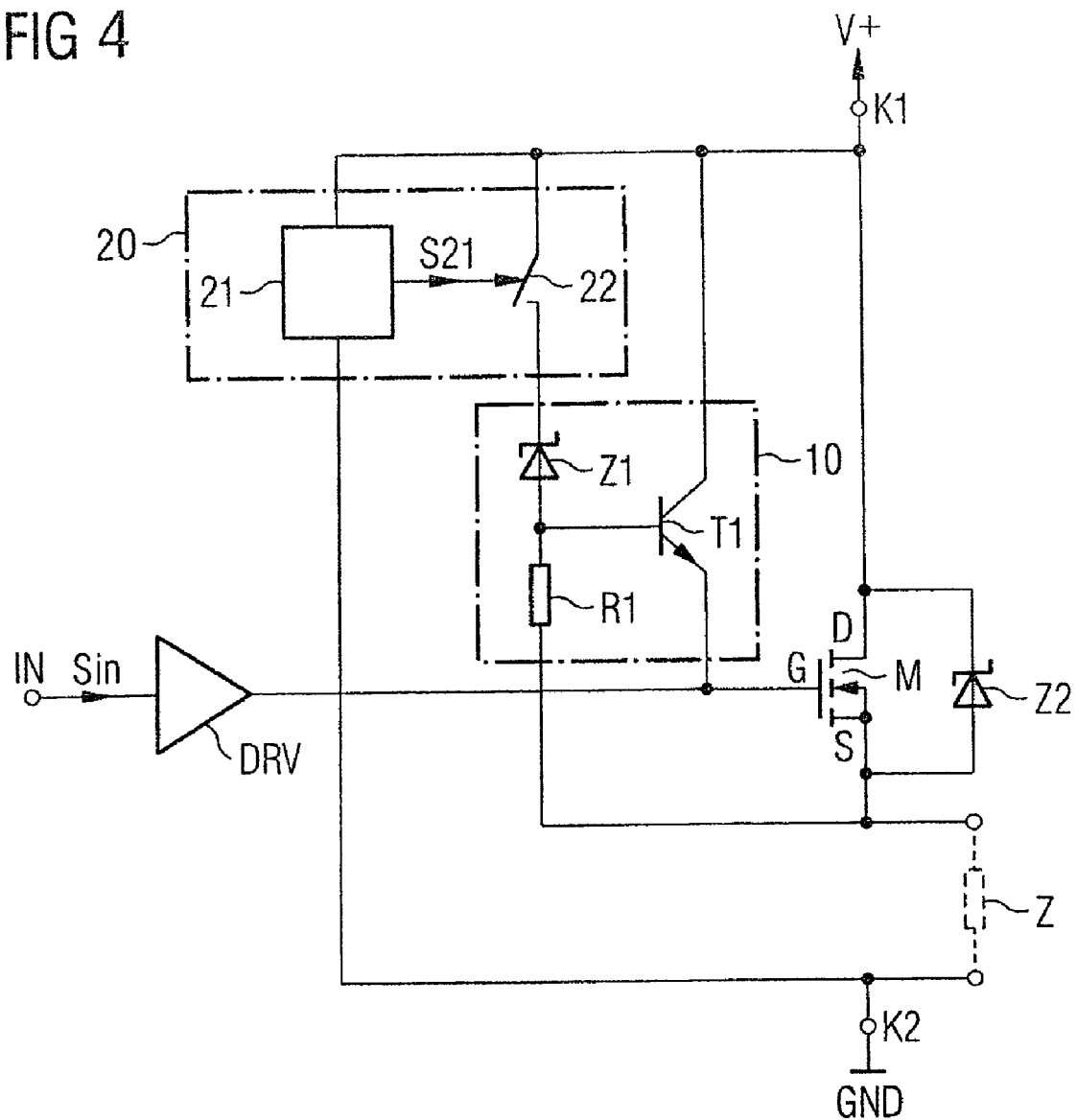
FIG. 4 shows a second exemplary embodiment of a circuit arrangement having a load transistor, a voltage limiting circuit and a deactivation circuit.

In the case of the exemplary embodiment of the circuit arrangement as illustrated in FIG. 4, the voltage limiting circuit 10 comprises a transistor T1, which, in the example, is formed as an npn bipolar transistor and the load path of which is connected between the drain connection D and the gate connection G of the load transistor M. In order to drive this bipolar transistor T1, a series circuit formed by a zener diode Z1 and a resistor R1 is present in parallel with the drain-source path D-S of the load transistor M. In this case, the base terminal of the transistor T1 is connected to a node common to the zener diode Z1 and the resistor R1. With the voltage limiting circuit 10 activated, the bipolar transistor T1 is driven into the on state in order to turn on the load transistor M if the load path voltage of the load transistor M exceeds the value of the breakdown voltage of the zener diode Z1.

In the case of the exemplary embodiment in accordance with FIG. 4, the switch 22 of the deactivation circuit 20 is connected in series with the zener diode Z1 and the resistor R1 between the drain and source terminals of the load transistor M.

Figure 5:
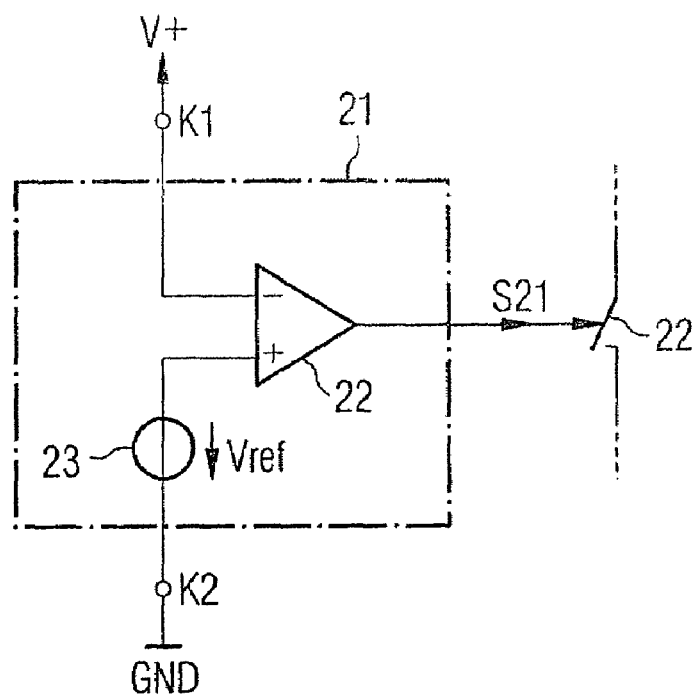
FIG. 5 illustrates a first exemplary realization of the deactivation circuit.

FIG. 5 schematically shows an exemplary embodiment of the drive circuit 21 that drives the switching element 22. The drive circuit comprises a comparator 22 having an output at which the drive signal S21 for the switching element 22 is available. A noninverting input of said comparator 22 is fed a reference voltage Vref that is supplied by a reference voltage source 23 and is referred to reference-ground potential GND, which reference voltage is compared by the comparator 22 with the supply voltage V+ present at an inverting input. The comparator output signal S21 assumes a high level in order to close the switch 22 if the supply voltage V+ is less than the reference voltage Vref, and the comparator output signal S21 assumes a low level in order to open the switch 22 and to deactivate the voltage limiting circuit if the supply voltage V+ exceeds the reference voltage Vref.

Figure 6:
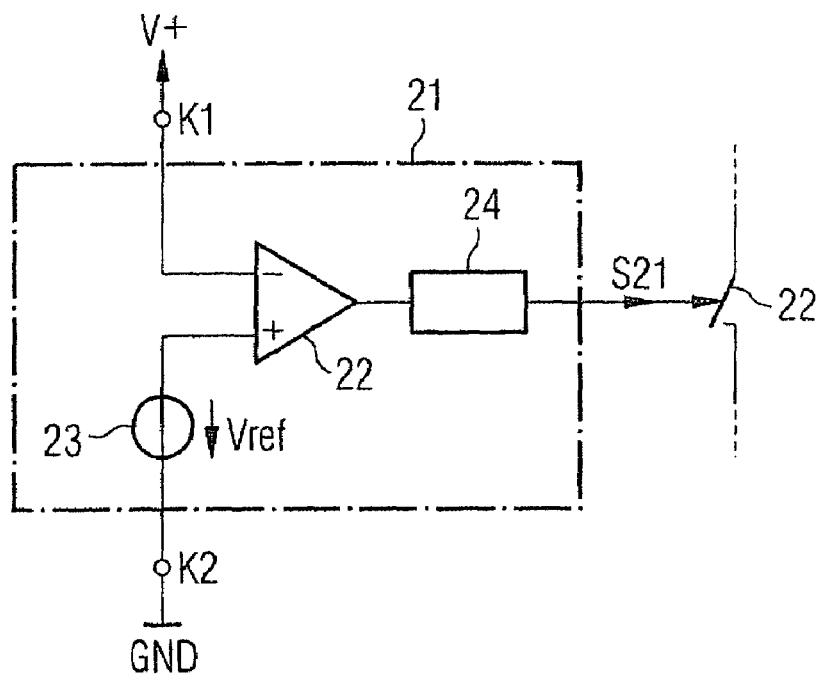
FIG. 6 illustrates a second exemplary embodiment of the deactivation circuit.

FIG. 6 shows a modification of the drive circuit illustrated in FIG. 5. Here a delay element 24 is connected downstream of the comparator 22 and in this case provides the drive signal S21 for the switch 22. Said delay element 24 is designed to forward falling edges of the comparator output signal 22 in a time-delayed manner and rising edges of the comparator output signal in a virtually undelayed manner for driving the switch 22. What is thereby achieved is that momentary fluctuations in the supply voltage V+ which are shorter than the delay time of the delay element 24 do not lead to an opening of the switch and thus do not lead to a deactivation of the voltage limiting circuits 10 illustrated in FIGS. 3 and 4.

Figure 7:
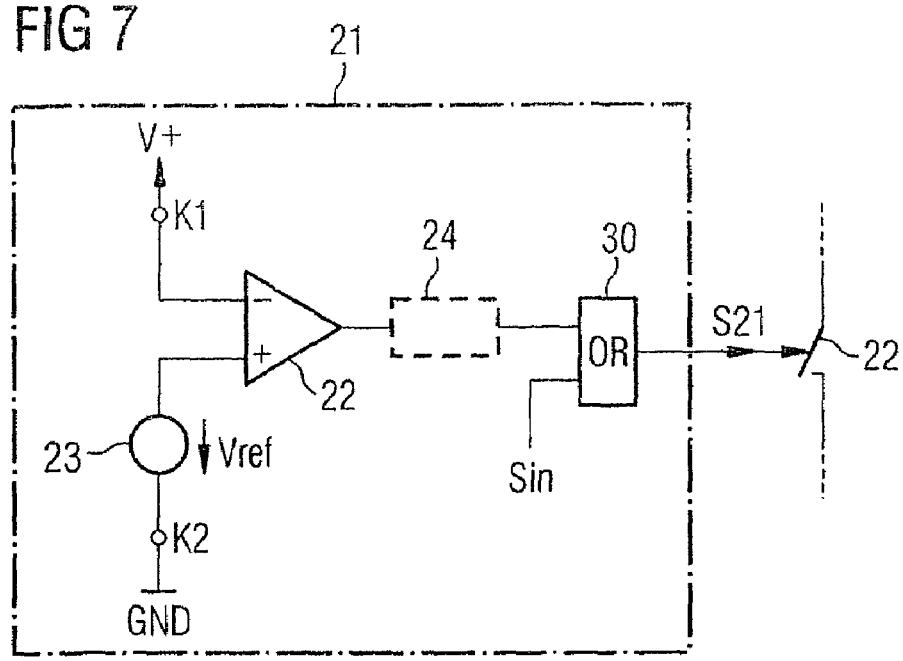
FIG. 7 shows a further exemplary embodiment of a deactivation circuit.

Referring to FIGS. 3 and 4, a drive signal Sin serves for driving the load transistor M, which drive signal is present at a drive input IN and is converted, by means of a driver circuit DRV, from a logic level to a level suitable for driving the load transistor M. In the case of the exemplary embodiment of the circuit arrangement according to the invention as illustrated in FIG. 7, provision is made for taking account of said drive signal Sin in the deactivation of the voltage limiting circuit 10 and for deactivating the voltage limiting circuit 10 at the earliest when the drive signal Sin assumes a turn-off level at which the load transistor M is turned off. FIG. 7 shows a drive circuit 21 that takes account of said drive signal Sin in the driving of the switching element 22. Said drive circuit 21 comprises, in addition to the comparator 22 and, if appropriate, the delay circuit 24, an OR gate 30, to which the input signal Sin is fed in addition to the (optionally delayed) comparator output signal and at the output of which the drive signal S21 is present. Said drive signal S21 assumes a low level, in order to open the switching element 22 and to deactivate the voltage limiting circuit 10, only when both the comparator output signal S22 and the drive signal Sin assume a low level, it being assumed that the load transistor M is turned off by a low level of the drive signal Sin.

Figure 8:
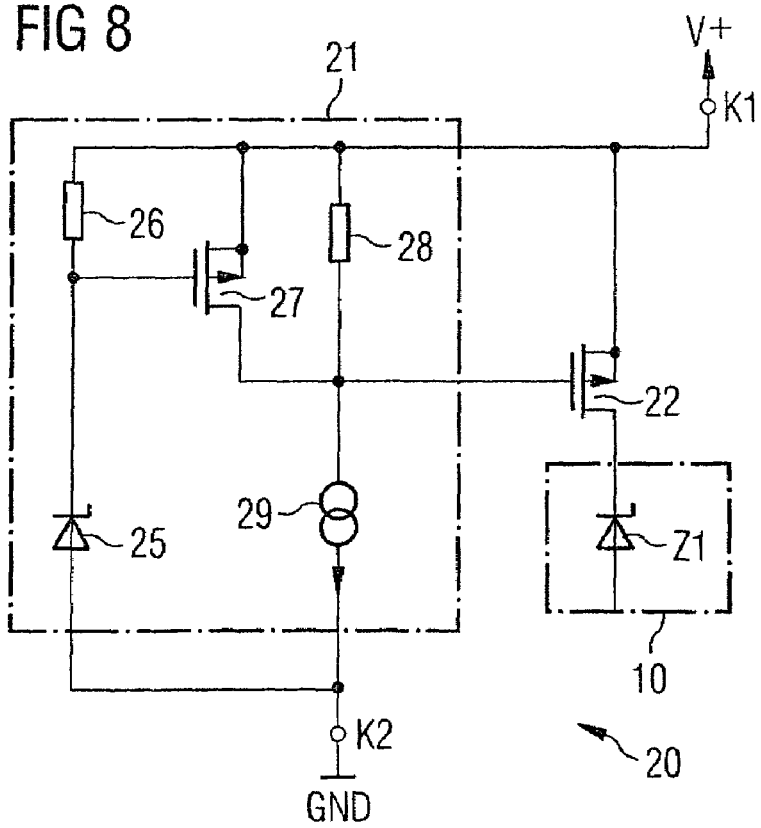
FIG. 8 illustrates an exemplary realization in terms of circuitry of the deactivation circuit.

An exemplary realization of the deactivation circuit in accordance with FIG. 5 at the circuit level is illustrated in FIG. 8. In this example, the deactivation circuit comprises, as switching element 22, a p-conducting transistor 22, the load path of which is connected between the first supply voltage terminal K1 and the voltage limiting circuit 10, illustrated in the figure in order to afford better understanding. Connected between the gate terminal of said transistor 22 and the first voltage supply terminal K1 is the load path of a further p-conducting transistor 27, with which a resistor 28 is connected in parallel. Connected in series with the parallel circuit formed by the transistor 27 and the resistor 28 is a current source 29, whose terminal remote from the transistor 27 and the resistor 28 is connected to the second supply voltage terminal K2. In the on state, the transistor 27 accepts the current taken up from the current source 29, the voltage drop across the load path of the transistor 27 in the on state being so small that the transistor 22 that is connected in series with the voltage limiting circuit 10 and serves as switching element turns off. The transistor 27 serving for driving the switching transistor 22 is driven by a series circuit formed by a resistor 26 and a zener diode 25, which series circuit is connected between the voltage supply terminals K1, K2. In this case, the drive terminal of the transistor 27 is connected to a node common to the resistor 26 and the zener diode 25 and is connected to the first voltage supply terminal K1 via the resistor 26.

The functioning of this deactivation circuit 20 in accordance with FIG. 8 is briefly explained below.

Figure 1:
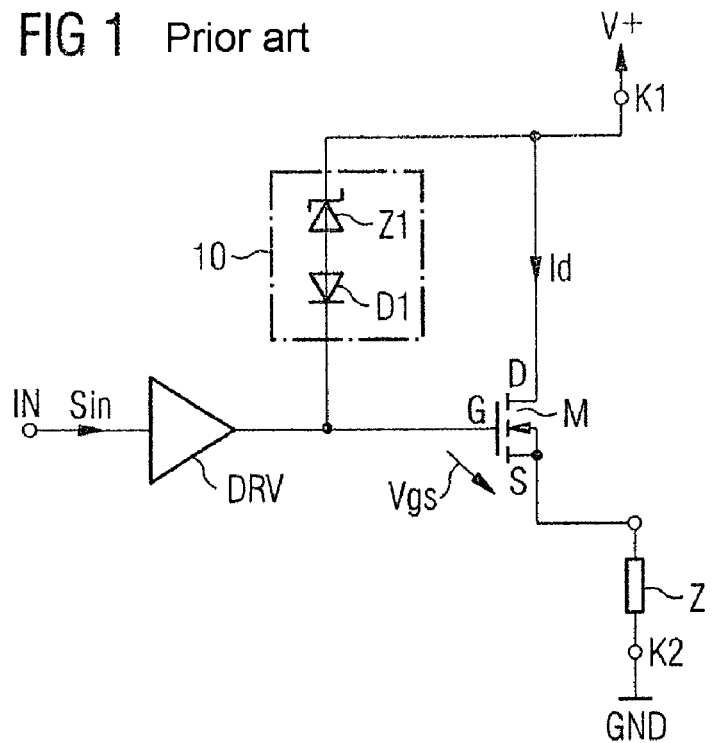
FIG. 1 shows a circuit arrangement having a load transistor and a voltage limiting circuit according to the prior art.
Figure 2:
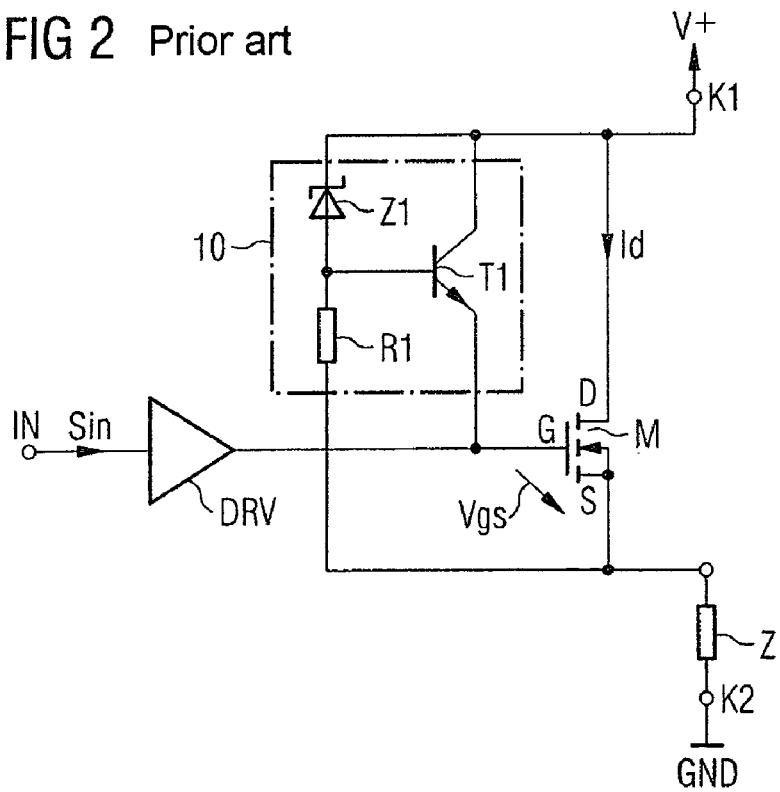
FIG. 2 shows a further circuit arrangement having a load transistor and a voltage limiting circuit according to the prior art.

If the supply voltage V+ is less than the breakdown voltage of the zener diode 25, then approximately the entire supply voltage is dropped across the zener diode 25, as a result of which the voltage drop across the resistor 26 is insufficient for keeping the transistor 27 in the on state. The current taken up from the current source 29 then brings about across the resistor 28 a voltage drop that suffices to drive the switching transistor 22 into the on state. If the supply voltage V+ rises above the value of the breakdown voltage of the zener diode 25, and if the breakdown current flowing through the zener diode 25 in this case reaches a value that suffices to bring about across the resistor 26 a voltage that suffices for driving the drive transistor 27 into the on state, then the switching transistor 22 is turned off and the voltage limiting circuit 10 is thus deactivated. The breakdown voltage of the zener diode 25 serves as reference voltage in the deactivation circuit in accordance with FIG. 2.

LIST OF REFERENCE SYMBOLS

D Drain terminal
DRV Driver circuit
G Gate terminal
GND Reference-ground potential, ground
IN Drive terminal
K1, K2 Supply voltage terminals
M Load transistor
R1 Resistor
S Source terminal
S21 Drive signal
Sin Drive signal
T1 Transistor
V+ Supply potential, supply voltage
Z Load
Z1 Zener diode
Z2 Internal zener diode
10 Voltage limiting circuit
20 Deactivation circuit
21 Drive circuit
22 Comparator, switching element, transistor
22 Switching element
23 Reference voltage source
24 Delay element
25 Zener diode
26, 28 Resistors
27 Transistor
29 Current source

The invention claimed is:

1. A circuit arrangement, comprising:
  a load transistor having a control terminal and first and second load terminals, the first and second load terminals operable to connect a load to a supply voltage,
  a drive terminal operably coupled to provide a drive signal to the control terminal of the load transistor,
  a voltage limiting circuit connected between the first load terminal and the control terminal of the transistor, and
  a deactivation circuit operably connected to selectively deactivate the voltage limiting circuit based on the supply voltage provided to the load, wherein the deactivation circuit is configured to deactivate the voltage limiting circuit if the supply voltage provided to the load is greater than a predetermined voltage value.

2. The circuit arrangement as claimed in claim 1, wherein the deactivation circuit is further configured to deactivate the voltage limiting circuit only after the supply voltage exceeds the predetermined voltage value for a delay period.

3. The circuit arrangement as claimed in claim 1, wherein the deactivation circuit includes a switching element connected in series with the voltage limiting circuit between the first load terminal and the control terminal, said switching element being driven by a drive circuit in a manner dependent on the supply voltage.

4. The circuit arrangement as claimed in claim 3, wherein the switching element comprises a transistor.

5. The circuit arrangement as claimed in claim 1, wherein the voltage limiting circuit comprises at least one zener diode and a diode connected oppositely to the zener diode.

6. The circuit arrangement as claimed in claim 1, wherein the voltage limiting circuit includes a transistor having a load path and a control terminal, the load path connected between the first load terminal and the control terminal of the load transistor.

7. The circuit arrangement as claimed in claim 1, wherein the deactivation circuit is configured to deactivate the voltage limiting circuit after the presence of a turn-off signal at the drive terminal.

8. The circuit arrangement as claimed in claim 1, wherein which the load transistor is integrated in a first semiconductor chip and the voltage limiting circuit and the deactivation circuit are integrated in a second semiconductor chip.

9. The circuit arrangement as claimed in claim 8, wherein the second semiconductor chip is physically supported by the first semiconductor chip.

10. The circuit arrangement as claimed in claim 1 wherein the predetermined value is selected such that the supply voltage becomes higher than a predetermined voltage value only under extraordinary operating conditions.

11. A method for driving a load transistor having a control terminal, which is coupled to a drive terminal for receiving a drive signal, the load transistor having first and second load terminals configure to connect a load to a supply voltage, the method comprising:
  a) employing a voltage limiting circuit connected between the first load terminal and the control terminal, and
  b) deactivating the voltage limiting circuit responsive to the supply voltage provided to the load being greater than a predetermined voltage value.

12. The method as claimed in claim 11, wherein step b) further comprises deactivating the voltage limiting circuit after a predetermined time duration after the supply voltage becomes higher than a predetermined value.

13. The method as claimed in claim 11, further comprising deactivating the voltage limiting circuit at the earliest with the presence of a turn-off signal at the drive terminal.

14. The method as claimed in claim 11 wherein the predetermined value is selected such that the supply voltage becomes higher than a predetermined voltage value only under extraordinary operating conditions.

15. A circuit arrangement, comprising:
  a load transistor having a control terminal and first and second load terminals, the first and second load terminals operable to connect a load to a supply voltage,
  a drive terminal operably coupled to provide a drive signal to the control terminal of the load transistor,
  a first circuit connected between the first load terminal and the control terminal of the transistor, the first circuit operable to provide voltage to the control terminal based on the supply voltage, and
  a second circuit operably connected to selectively inhibit the provision of voltage to the control terminal by the first circuit, the selective inhibition responsive to the supply voltage provided to the load being greater than a predetermined voltage value.

16. The circuit arrangement as claimed in claim 15, wherein the second circuit includes a switching element connected in series with the first circuit between the first load terminal and the control terminal, said switching element being selectively closed based on the supply voltage.

17. The circuit arrangement as claimed in claim 16, wherein the switching element comprises a transistor.

18. The circuit arrangement as claimed in claim 16, wherein the first circuit includes at least one zener diode.

19. The circuit arrangement as claimed in claim 18, wherein the first circuit includes at least one diode coupled in series to and oppositely biased from the at least one zener diode.

20. The circuit arrangement as claimed in claim 18, wherein the voltage limiting circuit includes a transistor having a load path and a control terminal, the load path connected between the first load terminal and the control terminal of the load transistor.

* * * * *